United States Patent
Song

(10) Patent No.: US 9,806,073 B2
(45) Date of Patent: *Oct. 31, 2017

(54) ELECTRONIC CIRCUITS INCLUDING DIODE-CONNECTED BIPOLAR JUNCTION TRANSISTORS

(71) Applicant: SK hynix Inc., Gyeonggi-do (KR)

(72) Inventor: Hyun Min Song, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/288,326

(22) Filed: Oct. 7, 2016

(65) Prior Publication Data

US 2017/0025409 A1 Jan. 26, 2017

Related U.S. Application Data

(63) Continuation of application No. 14/322,775, filed on Jul. 2, 2014, now Pat. No. 9,490,251.

(30) Foreign Application Priority Data

Feb. 10, 2014 (KR) .......................... 10-2014-0014897

(51) Int. Cl.
*H01L 27/06* (2006.01)
*H01L 29/73* (2006.01)
(Continued)

(52) U.S. Cl.
CPC ...... *H01L 27/0664* (2013.01); *H01L 27/1023* (2013.01); *H01L 29/0649* (2013.01); *H01L 29/0692* (2013.01); *H01L 29/0804* (2013.01); *H01L 29/41708* (2013.01); *H01L 29/7302* (2013.01); *H01L 29/732* (2013.01); *H01L 29/861* (2013.01)

(58) Field of Classification Search
CPC ....... G05F 3/30; H01L 27/1022; H01L 27/24; H01L 27/2445; H01L 21/8222; H01L 27/1026; H01L 29/66234
USPC ....... 257/163–166, 197, 205, 273, 351, 361, 257/378, 423, 427, 474, 477, 517, 526, 257/539, 544, 565–593, 928, E51.004, 257/E31.069, E27.017, E27.019–E27.023, 257/E27.037–E27.043, E27.053–E27.058, 257/E27.074–E27.078, E27.106, E27.149, 257/E29.03–E29.035, E29.044–E29.045, 257/E29.114, E29.124, E29.171–E29.202
See application file for complete search history.

(56) References Cited

U.S. PATENT DOCUMENTS 6,225,867 B1 * 5/2001 Ilowski .................. H03F 1/302
330/207 P
7,847,374 B1 * 12/2010 Wang .................. H01L 27/1026
257/560

(Continued)

*Primary Examiner* — Jonathan Han
(74) *Attorney, Agent, or Firm* — IP & T Group LLP

(57) ABSTRACT

A diode-connected bipolar junction transistor includes a common collector region of a first conductivity, a common base region of a second conductivity disposed over the common collector region, and a plurality of emitter regions of the first conductivity disposed over the common base region, arranged to be spaced apart from each other, and arranged to have island shapes. The common base region and the common collector region are electrically coupled to each other.

11 Claims, 8 Drawing Sheets

(51) Int. Cl.
*H01L 27/102* (2006.01)
*H01L 29/417* (2006.01)
*H01L 29/732* (2006.01)
*H01L 29/861* (2006.01)
*H01L 29/06* (2006.01)
*H01L 29/08* (2006.01)

(56) References Cited

U.S. PATENT DOCUMENTS

| | | | |
|---|---|---|---|
| 9,128,497 B2 * | 9/2015 | Li | G05F 3/30 |
| 2012/0068627 A1 * | 3/2012 | Brooks | H05B 33/0812 |
| | | | 315/309 |

* cited by examiner

ELECTRONIC CIRCUITS INCLUDING DIODE-CONNECTED BIPOLAR JUNCTION TRANSISTORS

CROSS-REFERENCE TO RELATED APPLICATION

This application is a continuation of U.S. patent application Ser. No. 14/322,775, filed on Jul. 2, 2014, which claims priority of Korean patent application number 10-2014-0014897, filed on Feb. 10, 2014. The disclosure of each of the foregoing applications is incorporated herein by reference in its entirety.

BACKGROUND

1. Technical Field

Various embodiments of the present disclosure relate to electronic circuits including bipolar junction transistors.

2. Related Art

A power supply voltage applied to an integrated circuit may vary due to various factors. The variation of the power supply voltage may affect operation currents of the integrated circuit and may even cause malfunctions of the integrated circuits. Thus, it is important to design a reference voltage generator or a reference current generator that produces a constant voltage level or a constant amount of current regardless of the variation of the power supply voltage. It is also important to minimize temperature sensitivity of the reference voltage generator or the reference current generator.

A reference voltage may be obtained by generating a constant voltage based on a band gap voltage of a silicon material. In general, a reference voltage circuit may include a pair of bipolar junction transistors, which have different current densities, and are coupled in parallel. In such a case, while an emitter-base voltage of each of the bipolar junction transistors has a positive temperature coefficient, a voltage difference between the emitter-base voltages of the pair of bipolar junction transistors may have a negative temperature coefficient. If the positive temperature coefficient and the negative temperature coefficient may be appropriately controlled to have the same absolute value, the reference voltage circuit may generate a constant reference voltage regardless of temperature variation. This reference voltage is known as close to the band gap voltage of the silicon material at zero (0) degree of the absolute temperature (OK). Also, this reference voltage circuit is referred to as a band gap reference (BGR) circuit. The BGR circuit is known as stable to the temperature variation, and widely used in integrated circuits. That is, if collector resistance values of the bipolar junction transistors may be appropriately controlled to cancel the positive temperature coefficient and the negative temperature coefficient of the bipolar junction transistors, the BGR circuit may generate a stable and constant reference voltage regardless of temperature variation. However, if the bipolar junction transistors are employed in the BGR circuit, the integration density of the BGR circuit may be degraded.

SUMMARY

Various embodiments are directed to electronic circuits including bipolar junction transistors.

According to an embodiment, an electronic circuit may include a diode-connected bipolar junction transistor. The diode-connected bipolar junction transistor may include a common collector region of a first conductivity, a common base region of a second conductivity disposed over the common collector region, and a plurality of emitter regions of the first conductivity disposed over the common base region, arranged to be spaced apart from each other, and arranged to have island shapes. The common base region and the common collector region are electrically coupled to each other

BRIEF DESCRIPTION OF THE DRAWINGS

Various embodiments will become more apparent in view of the attached drawings and accompanying detailed description, in which.

DETAILED DESCRIPTION OF THE EMBODIMENTS

The following embodiments may provide diode-connected bipolar junction transistors, and each of the diode-connected bipolar junction transistors may include a plurality of vertical bipolar junction transistors that share a single common collector region and a single common base region with a plurality of separate emitter regions. These diode-connected bipolar junction transistors may be used to realize circuits for generating reference voltages in memory devices or non-memory devices. The memory devices may include dynamic random access memory (DRAM) devices, static random access memory (SRAM) devices, flash memory devices, magnetic random access memory (MRAM) devices, phase changeable random access memory (PcRAM) devices, resistive random access memory (ReRAM) devices or ferroelectric random access memory (FeRAM) devices. The non-memory devices may include logic devices employing operational amplifiers (OP-AMPs), multi-stage amplifiers, sense amplifiers or the like.

In the following embodiments, it will be understood that when an element is referred to as being located "on", "over", "above", "under", "beneath" or "below" another element, it may directly contact the other element, or at least one intervening element may also be present therebetween. Accordingly, the terms such as "on", "over", "above", "under", "beneath", "below" and the like that are used herein are for the purpose of describing particular embodiments only and are not intended to limit other embodiments.

Figure 1:
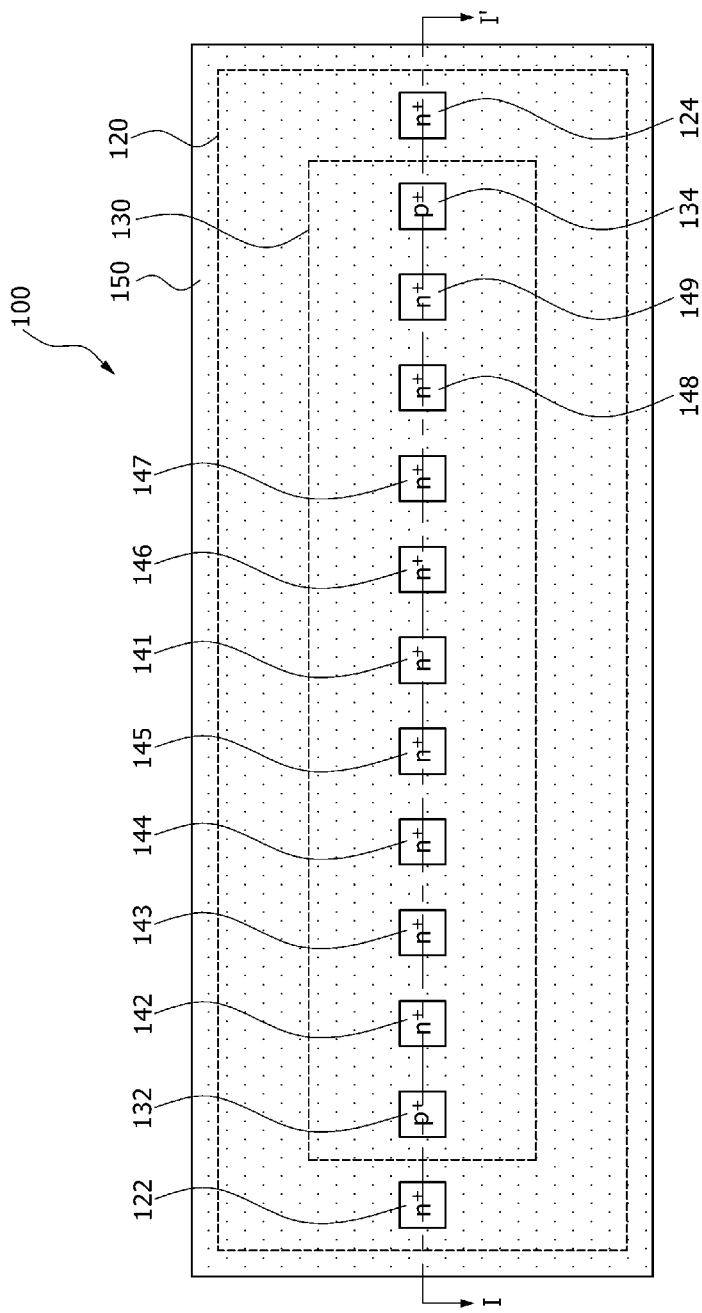
FIG. 1 is a layout diagram illustrating a diode-connected bipolar junction transistor according to an embodiment.
Figure 2:
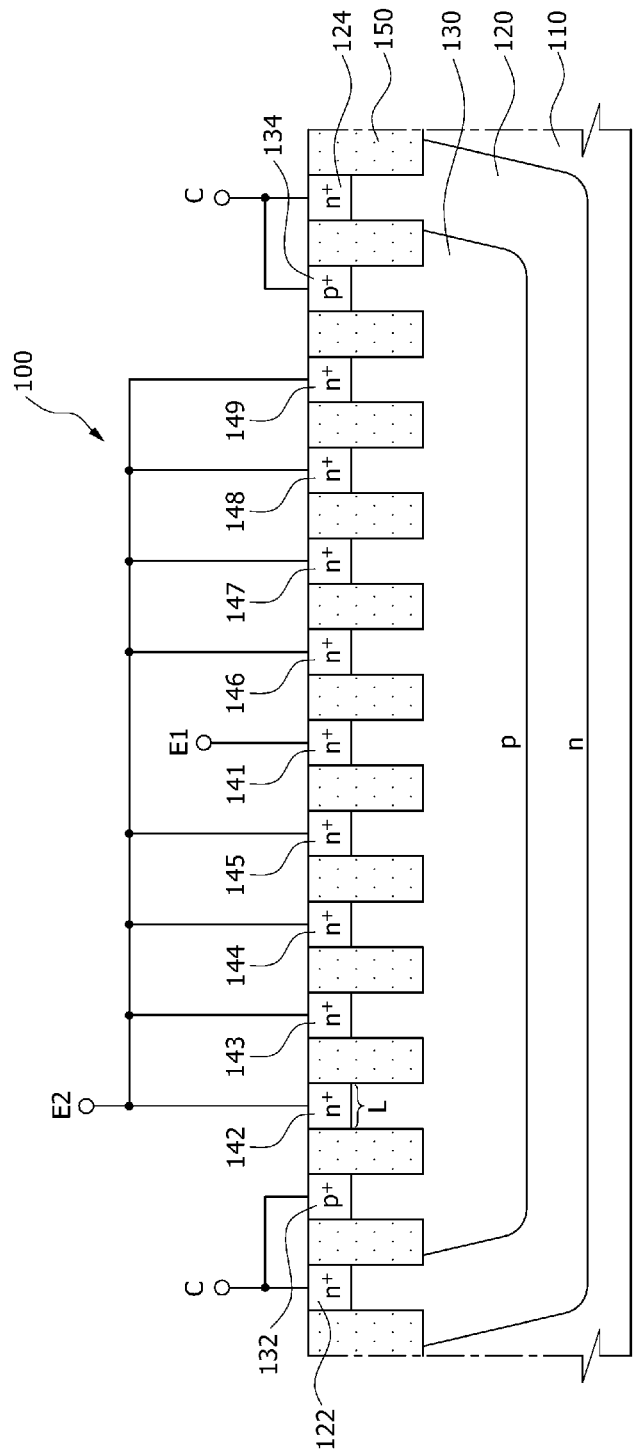
FIG. 2 is a cross-sectional view taken along line I-I' of FIG. 1.

Referring to FIGS. 1 and 2, a diode-connected bipolar junction transistor 100 according to an embodiment may include a plurality of N-P-N type bipolar junction transistors coupled in parallel. Each of the plurality of bipolar junction transistors may have a diode-connected structure in which a base region and a collector region of the bipolar junction transistor are electrically coupled to each other. Specifically, an N-type common collector region 120 may be disposed over a substrate 110. A P-type common base region 130 and N-type collector contact regions 122 and 124 may be disposed over the N-type common collector region 120. The N-type collector contact regions 122 and 124 may have greater impurity concentration than the impurity concentration of the N-type common collector region 120. The P-type common base region 130 may be surrounded by the N-type common collector region 120. A plurality of N-type emitter regions, for example, nine (9) N-type emitter regions 141 to 149 and P-type base contact regions 132 and 134 may be disposed over the P-type common base region 130. The N-type emitter regions 141 to 149 may be arrayed in one direction parallel with a top surface of the substrate 110, and may be spaced apart from each other to have island shapes. The P-type base contact regions 132 and 134 may have greater impurity concentration than the impurity concentration of the P-type common base region 130.

The N-type collector contact regions 122 and 124, the P-type base contact regions 132 and 134, and the N-type emitter regions 141 to 149 may be separated from each other by an isolation layer 150 disposed in the substrate 130. That is, the isolation layer 150 may be disposed between the N-type collector contact regions 122 and 124, the P-type base contact regions 132 and 134, and the N-type emitter regions 141 to 149. For example, the isolation layer 150 may be a trench isolation layer. The isolation layer 150 may have a thickness of about 300 nanometers. The N-type collector contact regions 122 and 124, the P-type base contact regions 132 and 134, and the N-type emitter regions 141 to 149 may have a depth of about 20% to about 40% of the thickness of the isolation layer 150. For example, when the isolation layer 150 has a thickness of about 300 nanometers, the N-type collector contact regions 122 and 124, the P-type base contact regions 132 and 134, and the N-type emitter regions 141 to 149 may have a depth of about 60 nanometers to about 120 nanometers. For example, contact areas between each of the N-type emitter regions 141 to 149 and the P-type common base region 130 may be substantially the same. The current drivability of each of the vertical bipolar junction transistors including the N-type emitter regions 141 to 149 may depend on the area of the contact surface L between each of the N-type emitter regions 141 to 149 and the P-type common base region 130. Thus, the current drivability of each of the vertical bipolar junction transistors including the N-type emitter regions 141 to 149 may be substantially the same.

One of the N-type emitter regions 141 to 149, for example, the N-type emitter region 141 may be electrically coupled to a first emitter node E1, and the other N-type emitter regions 141 to 149 may be electrically coupled to a second emitter node E2. For example, the emitter region 141 coupled to the first emitter node E1 may be disposed at the center of the N-type emitter regions 141 to 149 to improve the matching characteristics of the vertical bipolar junction transistors including the N-type emitter regions 141 to 149. The N-type collector contact regions 122 and 124 and the P-type base contact regions 132 and 134 may be electrically coupled to a collector node C to realize a diode-connected structure.

Figure 3:
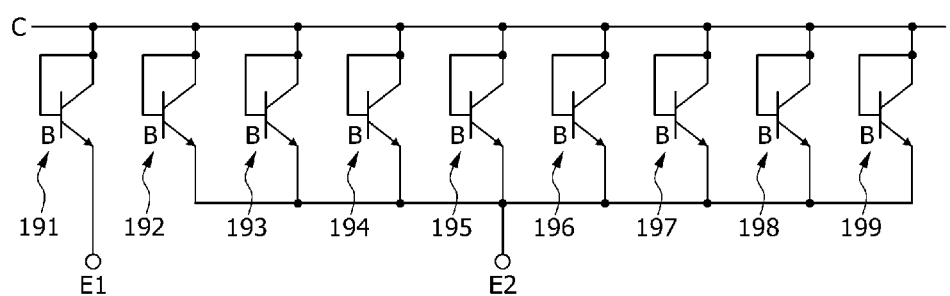
FIG. 3 is an equivalent circuit diagram of a diode-connected bipolar junction transistor shown in FIG. 1.

Referring to FIG. 3, all of the collectors of the nine (9) bipolar junction transistors 191 to 199 may be electrically coupled to the collector node C. Each of the bipolar junction transistors 191 to 199 may have a collector and a base coupled to each other. Thus, each of the bipolar junction transistors 191 to 199 may function as a diode-type bipolar junction transistor. That is, all of the bases and the collectors of the bipolar junction transistors 191 to 199 may be coupled to the collector node C. An emitter of the bipolar junction transistor 191 may be electrically coupled to the first emitter node E1, and emitters of the remaining bipolar junction transistors 192 to 199 may be electrically coupled to the second emitter node E2. As described with reference to FIGS. 1 and 2, all of the bipolar junction transistors 191 to 199 may share a single base, i.e., the P-type common base region 120, and a single collector, i.e., the N-type common collector region 130. The bipolar junction transistors 191 to 199 may include nine (9) separate emitters, i.e., the emitter regions 141 to 149, respectively.

Figure 4:
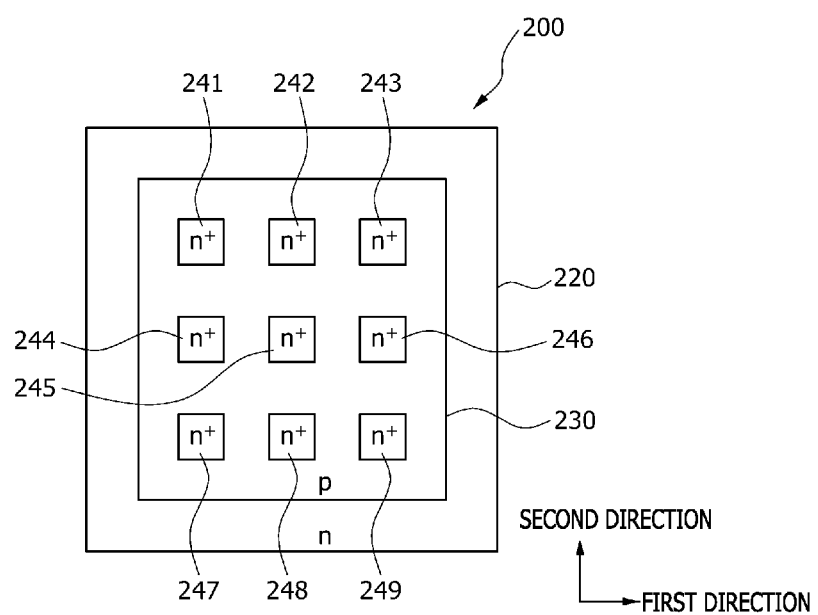
FIG. 4 is a layout diagram illustrating a diode-connected bipolar junction transistor according to an embodiment.

Referring to FIG. 4, a diode-connected bipolar junction transistor 200 according to an embodiment may include a plurality of N-P-N type bipolar junction transistors connected in parallel, and each of the N-P-N type bipolar junction transistors may function as a diode-type bipolar junction transistor whose base region and collector region are electrically coupled to each other. That is, a P-type common base region 230 may be disposed in an N-type common collector region 220, and a plurality of N-type emitter regions, for example, nine (9) N-type emitter regions 241 to 249, may be disposed in the P-type common base region 230 to be spaced apart from each other. The N-type emitter regions 241 to 249 may be disposed in array. For example, the N-type emitter regions 241 to 249 may be arrayed in three rows parallel with a first direction, and in three columns parallel with a second direction. The diode-connected bipolar junction transistor 200 according to the present embodiment may be the same as the diode-connected bipolar junction transistor 100 described with reference to FIGS. 2 and 3 except that the N-type emitter regions 241 to 249 are disposed in array.

Figure 5:
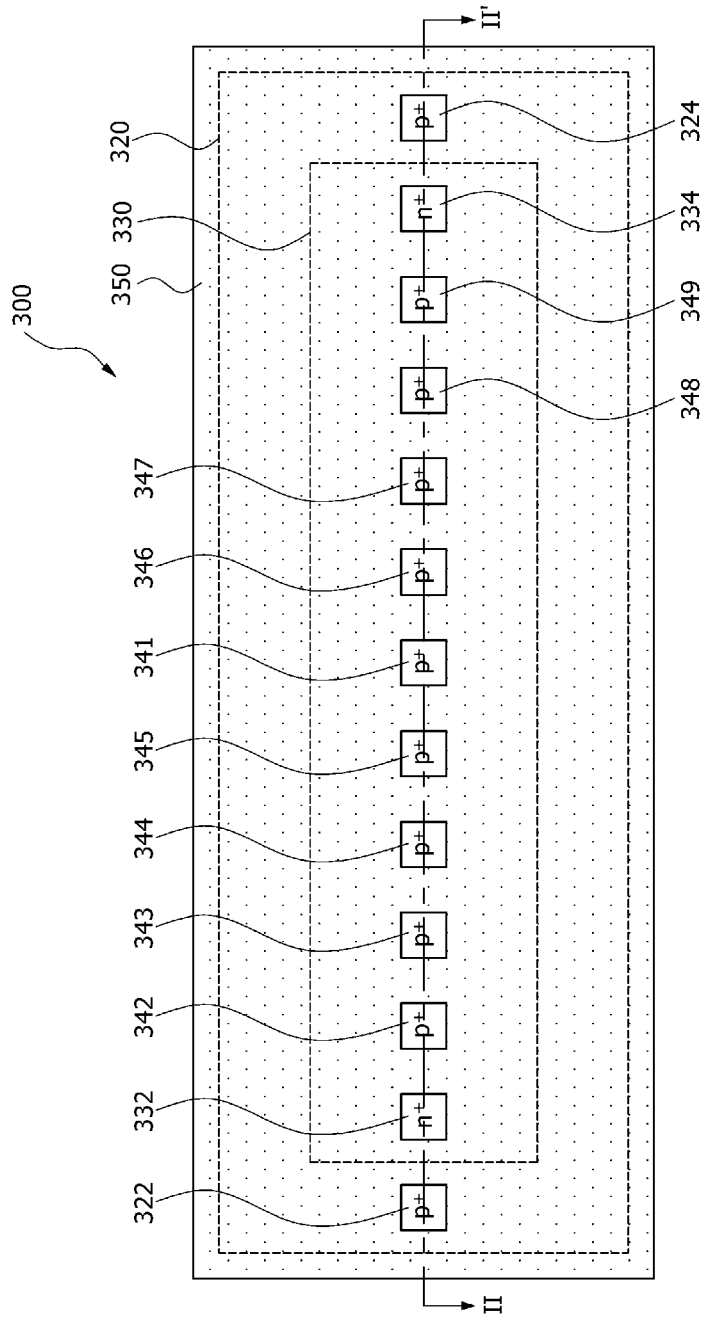
FIG. 5 is a layout diagram illustrating a diode-connected bipolar junction transistor according to an embodiment.
Figure 6:
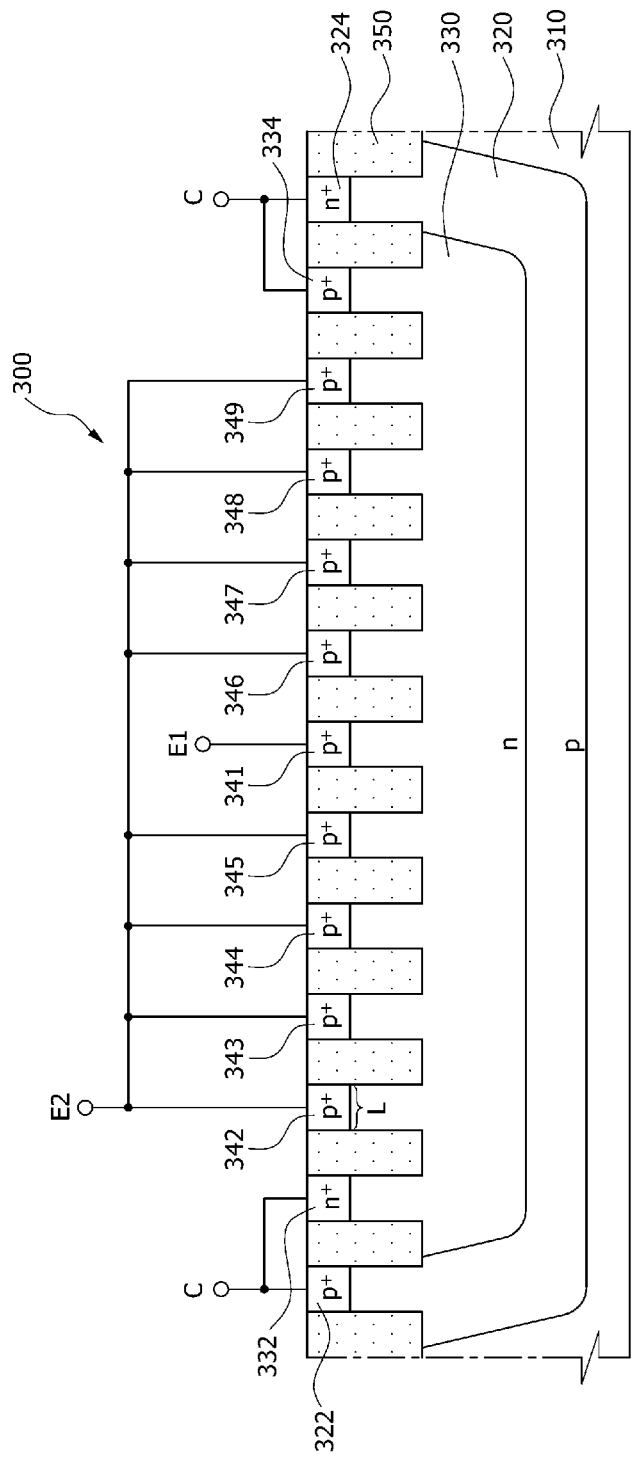
FIG. 6 is a cross-sectional view taken along line II-II' of FIG. 5.

Referring to FIGS. 5 and 6, a diode-connected bipolar junction transistor 300 according to an embodiment may include a plurality of P-N-P type bipolar junction transistors coupled in parallel. Each of the plurality of bipolar junction transistors may have a diode-connected structure in which a base region and a collector region of the bipolar junction transistor are electrically coupled to each other. Specifically, a P-type common collector region 320 may be disposed over a substrate 310. When the substrate 310 is a P-type substrate, the substrate 310 may serve as the P-type common collector region 320. An N-type common base region 330 and P-type collector contact regions 322 and 324 may be disposed over the P-type common collector region 320. The P-type collector contact regions 322 and 324 may have greater impurity concentration than the impurity concentration of the P-type common collector region 320. The N-type common base region 330 may be surrounded by the P-type common collector region 320. A plurality of P-type emitter regions, for example, nine (9) P-type emitter regions 341 to 349 and N-type base contact regions 332 and 334 may be disposed over the N-type common base region 330. The P-type emitter regions 341 to 349 may be arrayed in one direction parallel with a top surface of the substrate 310, and may be spaced apart from each other to have island shapes. The N-type base contact regions 332 and 334 may have greater impurity concentration than the impurity concentration of the N-type common base region 330.

The P-type collector contact regions 322 and 324, the N-type base contact regions 332 and 334, and the P-type emitter regions 341 to 349 may be separated from each other by an isolation layer 350 disposed in the substrate 330. That is, the isolation layer 350 may be disposed between the P-type collector contact regions 322 and 324, the N-type base contact regions 332 and 334, and the P-type emitter regions 341 to 349. For example, the isolation layer 350 may be a trench isolation layer. The isolation layer 350 may have a thickness of about 300 nanometers. The P-type collector contact regions 322 and 324, the N-type base contact regions 332 and 334, and the P-type emitter regions 341 to 349 may have a depth of about 20% to about 40% of the thickness of the isolation layer 350. For example, when the isolation layer 350 has a thickness of about 300 nanometers, the P-type collector contact regions 322 and 324, the N-type base contact regions 332 and 334, and the P-type emitter regions 341 to 349 may have a depth of about 60 nanometers to about 120 nanometers. For example, contact areas between each of the P-type emitter regions 341 to 349 and the N-type common base region 330 may be substantially the same. The current drivability of each of the vertical bipolar junction transistors including the P-type emitter regions 341 to 349 may depend on the area of the contact surface L between each of the P-type emitter regions 341 to 349 and the N-type common base region 330. Thus, the current drivability of each of the vertical bipolar junction transistors including the P-type emitter regions 341 to 349 may be substantially the same.

One of the P-type emitter regions 341 to 349, for example, the P-type emitter region 341, may be electrically coupled to a first emitter node E1, and the other P-type emitter regions 341 to 349 may be electrically coupled to a second emitter node E2. For example, the emitter region 341 coupled to the first emitter node E1 may be disposed at the center of the P-type emitter regions 341 to 349 to improve matching characteristics of the vertical bipolar junction transistors including the P-type emitter regions 341 to 349. The P-type collector contact regions 322 and 324 and the N-type base contact regions 332 and 334 may be electrically coupled to a collector node C to realize a diode-connected structure.

Figure 7:
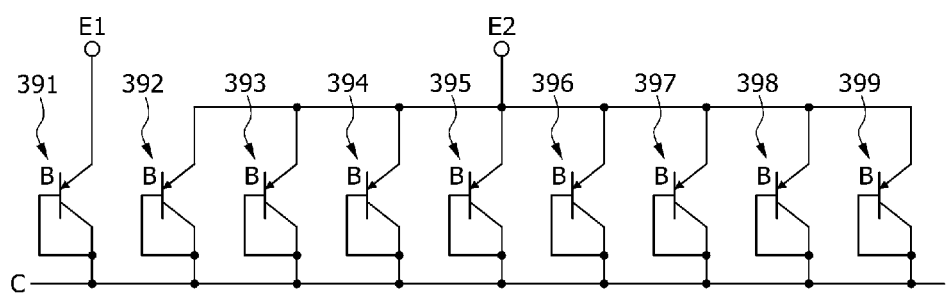
FIG. 7 is an equivalent circuit diagram of a diode-connected bipolar junction transistor shown in FIG. 5.

Referring to FIG. 7, all of the collectors of the nine (9) bipolar junction transistors 391 to 399 may be electrically coupled to the collector node C. Each of the bipolar junction transistors 391 to 399 may have a collector and a base coupled to each other. Thus, each of the bipolar junction transistors 391 to 399 may function as a diode-type bipolar junction transistor. That is, all of the bases and the collectors of the bipolar junction transistors 391 to 399 may be coupled to the collector node C. An emitter of the bipolar junction transistor 391 may be electrically coupled to the first emitter node E1, and emitters of the remaining bipolar junction transistors 392 to 399 may be electrically coupled to the second emitter node E2. As described with reference to FIGS. 5 and 6, all of the bipolar junction transistors 391 to 399 may share a single base, i.e., the N-type common base region 320, and a single collector, i.e., the P-type common collector region 330. The bipolar junction transistors 391 to 399 may include nine (9) separate emitters, i.e., the emitter regions 341 to 349, respectively.

Figure 8:
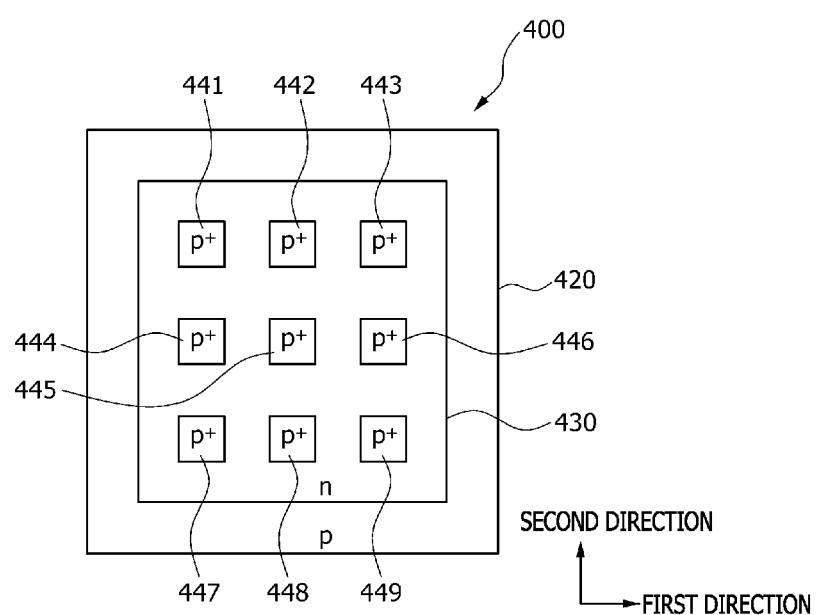
FIG. 8 is a layout diagram illustrating a diode-connected bipolar junction transistor according to an embodiment.

Referring to FIG. 8, a diode-connected bipolar junction transistor 400 according to an embodiment may include a plurality of P-N-P type bipolar junction transistors coupled in parallel, and each of the P-N-P type bipolar junction transistors may function as a diode-type bipolar junction transistor whose base region and collector region are electrically coupled to each other. That is, an N-type common base region 430 may be disposed in a P-type common collector region 420, and a plurality of P-type emitter regions, for example, nine (9) P-type emitter regions 441 to 449, may be disposed in the N-type common base region 430 to be spaced apart from each other. The P-type emitter regions 441 to 449 may be disposed in array. For example, the P-type emitter regions 441 to 449 may be arrayed in three rows parallel with a first direction, and in three columns parallel with a second direction. The diode-connected bipolar junction transistor 400 according to the present embodiment may be the same as the diode-connected bipolar junction transistor 300 described with reference to FIGS. 5 and 6 except that the P-type emitter regions 441 to 449 are disposed in array.

Figure 9:
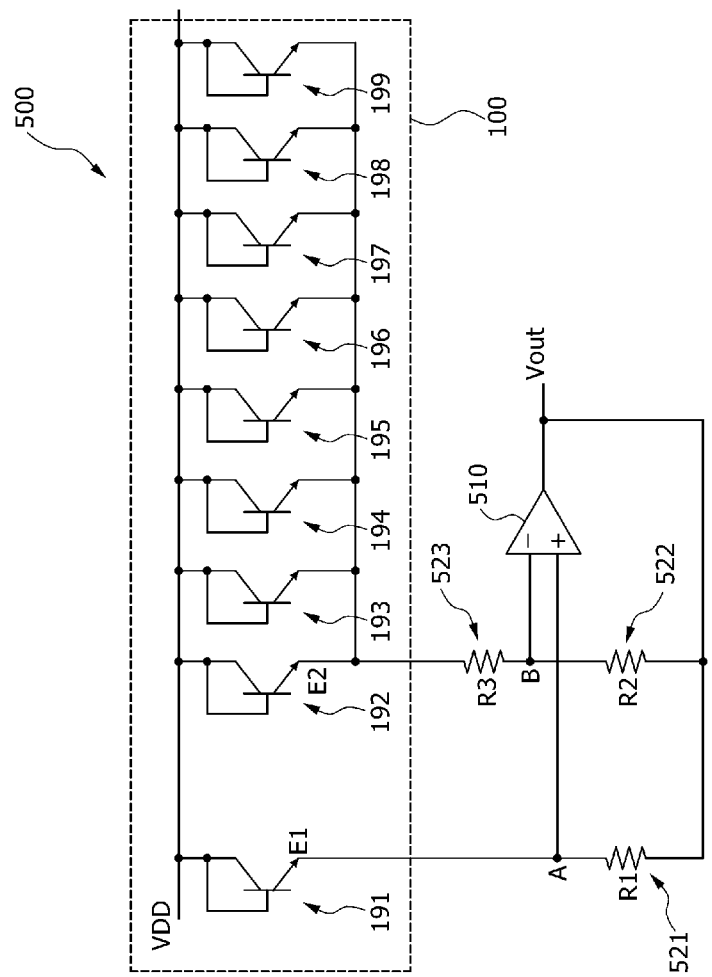
FIG. 9 is a circuit diagram illustrating an electronic circuit including a diode-connected bipolar junction transistor according to an embodiment.

Referring to FIG. 9, an electronic circuit 500 may be a band gap reference (BGR) circuit. The electronic circuit 500 may include three resistors 521, 522 and 523, an operational amplifier 510, and a diode-connected bipolar junction transistor 100. The diode-connected bipolar junction transistor 100 may be the one described with reference to FIGS. 1, 2 and 3. When a power supply voltage VDD is applied to the collectors of the N-P-N type bipolar junction transistors 191 to 199, a collector current may flow through the N-P-N type bipolar junction transistors 191 to 199. As a result, a first emitter-base voltage VBE1 may be generated between the first emitter node E1 and the base, i.e., the power supply voltage VDD, of the N-P-N type bipolar junction transistor 191, and a second emitter-base voltage VBE2 may be generated between the second emitter node E2 and the bases, i.e., the power supply voltage VDD, of the N-P-N type bipolar junction transistors 192 to 199.

The first emitter node E1 of the bipolar junction transistor 191 may be coupled to a first node of the resistor 521 at a node A, and the second emitter node E2 of the bipolar junction transistors 192 to 199 may be coupled to a first node of the resistor 523. The first node of the resistor 521 and a positive input node of the operational amplifier 510 may be coupled to each other at the node A. A second node of the resistor 523, a first node of the resistor 522 and a negative input node of the operational amplifier 510 may be electrically coupled in common at a node B. Second nodes of the resistors 521 and 522 may be electrically coupled to an output node Vout of the operational amplifier 510.

The operational amplifier 510 may normalize voltages of the nodes A and B to output a band gap voltage through the output node Vout thereof. The band gap voltage, that is, a band gap reference voltage $V_{REF}$ may be represented by the following equation 1.

$$V_{REF} = VDD - \left[ V_{BE2} + \left(1 + \frac{R_2}{R_3}\right) \cdot \ln(n) \cdot V_T \right] \quad \text{Equation 1}$$

In Equation 1, "VDD" denotes the power supply voltage, "$V_{BE2}$" denotes the voltage between the second emitter node E2 and the bases of the bipolar junction transistors 192 to 199, "R2" denotes the resistance value of the resistor 522, "R3" denotes the resistance value of the resistor 523, "VT" denotes "kT/q" representing a positive temperature coefficient, and "n" denotes the number of bipolar junction transistors 192 to 199 coupled in parallel to the second emitter node E2.

As can be seen from equation 1, the band gap reference voltage $V_{REF}$ may be obtained by adding a voltage component $V_{BE2}$ having a negative temperature coefficient to a voltage component VT having a positive temperature coefficient. In such a case, when the resistance values R2 and R3 are appropriately adjusted such that the negative temperature coefficient and the positive temperature coefficient have the same absolute value, the band gap reference voltage $V_{REF}$ may have a constant value regardless of temperature variation.

Figure 10:
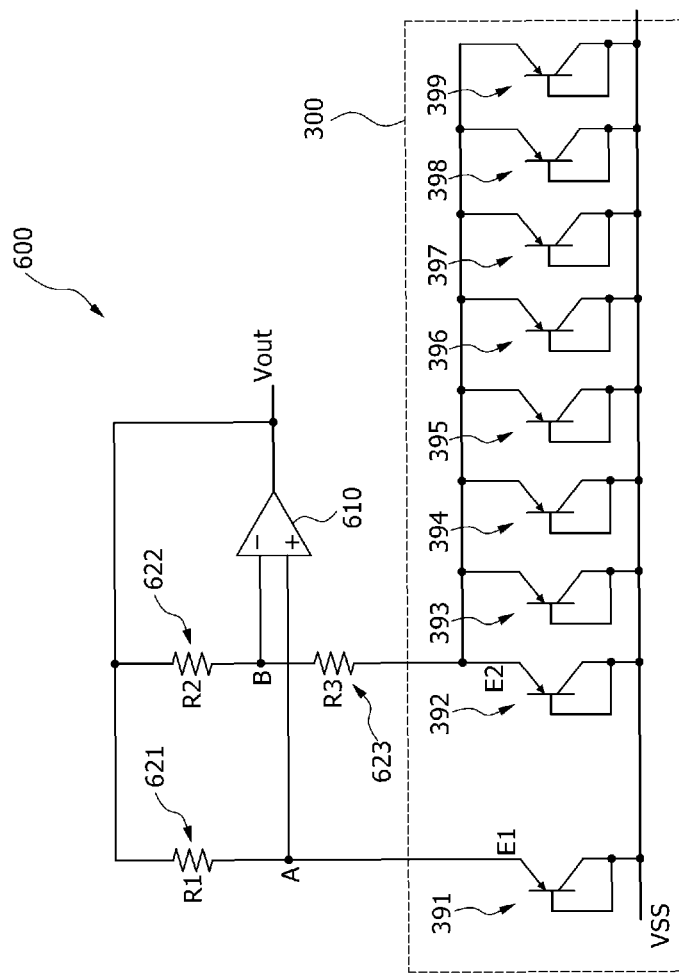
FIG. 10 is a circuit diagram illustrating an electronic circuit including a diode-connected bipolar junction transistor according to an embodiment.

Referring to FIG. 10, the electronic circuit 600 may be a band gap reference (BGR) circuit. The electronic circuit 600 may include three resistors 621, 622 and 623, an operational amplifier 610, and a diode-connected bipolar junction transistor 300. The diode-connected bipolar junction transistor 300 may be the one described with reference to FIGS. 5, 6 and 7. All of collectors and bases of the bipolar junction transistors 391 to 399 may be electrically coupled to a ground voltage VSS. When a bias voltage is applied between the first emitter node E1 and the ground voltage VSS, a first collector current may flow through the bipolar junction transistor 391 to generate a first emitter-base voltage (VBE1) between the first emitter node E1 and the base, the ground voltage VSS of the P-N-P type bipolar junction transistor 391. Moreover, when a bias voltage is applied between the second emitter node E2 and the ground voltage VSS, a second collector current may flow through the bipolar junction transistors 392 to 399 to generate a second emitter-base voltage (VBE2) between the second emitter node E2 and the base, i.e., the ground voltage VSS of the P-N-P type bipolar junction transistors 392 to 399.

The first emitter node E1 of the bipolar junction transistor 391 may be coupled to a first node of the resistor 621 at a node A, and the second emitter node E2 of the bipolar junction transistors 392 to 399 may be coupled to a first node of the resistor 623. The first node of the resistor 621 and a positive input node of the operational amplifier 610 may be coupled to each other at the node A. A second node of the resistor 623, a first node of the resistor 622, and a negative input node of the operational amplifier 610 may be electrically coupled in common at a node B. Second nodes of the resistors 621 and 622 may be electrically coupled to an output node Vout of the operational amplifier 610.

The operational amplifier 610 may normalize voltages of the nodes A and B to output a band gap voltage through the output node Vout thereof. The band gap voltage, that is, a band gap reference voltage $V_{REF}$ may be represented by the following equation 2.

$$V_{REF} = V_{BE2} + \left\{ \left(1 + \frac{R_2}{R_3}\right) \cdot \ln(n) \right\} \cdot V_T \quad \text{Equation 2}$$

In Equation 2, "$V_{BE2}$" denotes the voltage between the second emitter node E2 and the bases of the bipolar junction transistors 392 to 399, "R2" denotes the resistance value of the resistor 622, "R3" denotes the resistance value of the resistor 623, "VT" denotes "kT/q" representing the positive temperature coefficient, and "n" denotes the number of the bipolar junction transistors 392 to 399 coupled in parallel to the second emitter node E2.

As can be seen from Equation 2, the band gap reference voltage $V_{REF}$ may be obtained by adding a voltage component $V_{BE2}$ having a negative temperature coefficient to a voltage component VT having a positive temperature coefficient. In such a case, when the resistance values R2 and R3 are appropriately adjusted such that the negative temperature coefficient and the positive temperature coefficient have the same absolute value, the band gap reference voltage $V_{REF}$ may have a constant value regardless of temperature variation.

The embodiments have been disclosed above for illustrative purposes. Those skilled in the art will appreciate that various modifications, additions and substitutions are possible.

What is claimed is:

1. An electronic circuit comprising a diode-connected bipolar junction transistor,
   wherein the diode-connected bipolar junction transistor comprises:
   a common collector region of a first conductivity;
   a common base region of a second conductivity disposed over the common collector region; and
   a plurality of emitter regions of the first conductivity disposed over the common base region, arranged to be spaced apart from each other, and arranged to have island shapes,
   wherein the common base region and the common collector region are electrically coupled to a collector node.

2. The electronic circuit of claim 1, wherein the diode-connected bipolar junction transistor is an N-P-N type bipolar junction transistor.

3. The electronic circuit of claim 2, wherein a first emitter region of the plurality of emitter regions is coupled to a first emitter node and the others of the plurality of emitter regions are coupled to a second emitter node.

4. The electronic circuit of claim 3, wherein the common base region and the common collector region are electrically coupled to a power supply voltage.

5. The electronic circuit of claim 4, further comprising an operational amplifier,
   wherein a positive input node of the operational amplifier is electrically coupled to the first emitter node, and a negative input node of the operational amplifier is electrically coupled to the second emitter node.

6. The electronic circuit of claim 5, further comprising:
   a first resistor coupled between the first emitter node and an output node of the operational amplifier;
   a second resistor coupled between the negative input node and the output node; and
   a third resistor coupled between the negative input node and the second emitter node.

7. The electronic circuit of claim 1, wherein the diode-connected bipolar junction transistor is a P-N-P type bipolar junction transistor.

8. The electronic circuit of claim 7, wherein a first emitter region of the plurality of emitter regions is coupled to a first emitter node and the others of the plurality of emitter regions are coupled to a second emitter node.

9. The electronic circuit of claim 8, wherein the common base region and the common collector region are electrically coupled to a ground voltage.

10. The electronic circuit of claim 9, further comprising an operational amplifier,
    wherein a positive input node of the operational amplifier is electrically coupled to the first emitter node and a negative input node of the operational amplifier is electrically coupled to the second emitter node.

11. The electronic circuit of claim 10, further comprising:
    a first resistor coupled between the first emitter node and an output node of the operational amplifier;
    a second resistor coupled between the negative input node and the output node; and a third resistor coupled between the negative input node and the second emitter node.

* * * * *